(12) United States Patent
Fagerlund et al.

(10) Patent No.: US 12,458,272 B2
(45) Date of Patent: Nov. 4, 2025

(54) MEDICAL DEVICE WITH NOVEL ELECTRICAL INTERCONNECTS, AND RELATED METHODS

(71) Applicant: Boston Scientific Scimed Inc., Maple Grove, MN (US)

(72) Inventors: Robert K. Fagerlund, White Bear Lake, MN (US); Javier O. Martinez, Golden Valley, MN (US); Steven J. Meyer, Lake Elmo, MN (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 755 days.

(21) Appl. No.: 17/504,075

(22) Filed: Oct. 18, 2021

(65) Prior Publication Data

US 2022/0117539 A1    Apr. 21, 2022

Related U.S. Application Data

(60) Provisional application No. 63/094,113, filed on Oct. 20, 2020.

(51) Int. Cl.
*A61B 5/367* (2021.01)
*A61B 5/287* (2021.01)
(Continued)

(52) U.S. Cl.
CPC .............. *A61B 5/367* (2021.01); *A61B 5/287* (2021.01); *A61B 8/12* (2013.01); *A61B 8/445* (2013.01); *A61B 18/1492* (2013.01); *H05K 1/119* (2013.01); *A61B 2018/00351* (2013.01); *A61B 2018/00577* (2013.01); *A61B 2562/12* (2013.01); *H05K 2201/09027* (2013.01); *H05K 2201/09063* (2013.01); *H05K 2201/09236* (2013.01)

(58) Field of Classification Search
None
See application file for complete search history.

(56) References Cited

U.S. PATENT DOCUMENTS

5,444,254 A    8/1995  Thomson
5,555,618 A    9/1996  Winkler
(Continued)

*Primary Examiner* — Shahdeep Mohammed
(74) *Attorney, Agent, or Firm* — Nelson Mullins Riley & Scarborough LLP (57) ABSTRACT

Medical devices include an elongate tubular shaft having a first and opposite second end; an electrical component located proximate the first end; a plurality of electrical conductors extending through the shaft and in electrical communication with the electrical component; and an interposer element mechanically and electrically coupling electrical conductors to the electrical component. The interposer element includes a backing element defining a longitudinal axis thereof and having a first and opposite second end portion. The first end portion having a forward edge defined by a center forward edge portion and first and second lateral forward edge portions on opposite sides thereof. The first and second lateral forward edge portions angularly extend relative to the center forward edge portion. The forward edge being shaped to facilitate, during assembly of the medical device, advancement of the interposer element through the elongate shaft with electrical conductors preattached to the interposer element.

16 Claims, 11 Drawing Sheets

(51) Int. Cl.
*A61B 8/00* (2006.01)
*A61B 8/12* (2006.01)
*A61B 18/14* (2006.01)
*H05K 1/11* (2006.01)
*A61B 18/00* (2006.01)

(56) References Cited

U.S. PATENT DOCUMENTS

| | | |
|---|---|---|
| 7,351,914 B2 | 4/2008 | Kaneto |
| 2015/0366508 A1* | 12/2015 | Chou ................... A61N 1/056 600/467 |
| 2018/0264519 A1 | 9/2018 | Sudol |
| 2018/0303414 A1* | 10/2018 | Toth ................... A61N 1/36135 |
| 2019/0133527 A1 | 5/2019 | Kuisma |
| 2019/0282204 A1 | 9/2019 | Sudol et al. |
| 2021/0187241 A1* | 6/2021 | Govari .............. A61M 25/0158 |

* cited by examiner

MEDICAL DEVICE WITH NOVEL ELECTRICAL INTERCONNECTS, AND RELATED METHODS

CROSS REFERENCE TO RELATED APPLICATION

This application claims priority to Provisional Application No. 63/094,113, filed Oct. 20, 2020, which is herein incorporated by reference in its entirety.

TECHNICAL FIELD

The present disclosure relates to medical devices and methods for use in diagnostic and therapeutic procedures. More specifically, the invention relates to devices and methods for manufacturing catheters or probes having electrical elements for sensing physiological characteristics and/or delivering therapeutic energy to desired treatment sites.

BACKGROUND

An assortment of electrophysiology catheters can be used in a variety of diagnostic and/or therapeutic medical procedures to diagnose and/or correct conditions. These electrophysiology catheters can include mapping catheters, ablation catheters, cryotherapy catheters, and the like. It is typical to use these catheters in the diagnosis and correction of cardiac arrhythmias, including for example, atrial tachycardia, ventricular tachycardia, atrial fibrillation, and atrial flutter. Cardiac arrhythmias are a leading cause of stroke, heart disease, and sudden death. The physiological mechanism of arrhythmia involves an abnormality in the electrical conduction of the heart. There are a number of treatment options for patients with arrhythmia that include medication, implantable devices, and catheter ablation of cardiac tissue. As an example, certain medical procedures can include assessing a patient's pulmonary vein using a mapping catheter followed by treating mapped cardiac arrythmias with an ablation and/or cryotherapy catheter.

SUMMARY

The present disclosure relates to devices and methods for constructing catheters or probes having electrical elements for sensing physiological characteristics and/or delivering therapeutic energy to desired treatment sites. Electrophysiology catheters are used to understand and map electrical activity within a patient's heart. An electrophysiology study will use electrophysiology catheters during diagnostic and/or therapeutic medical procedures to diagnose and/or correct conditions of the patient's heart. Electrical connections within the medical device formed by electrical conductors (e.g., wires) can facilitate performing certain electrically-powered functions, such as mapping and therapy delivery. Quick, reliable, and easy-to-form electrical connections of these electrical components are desirable for quick assembly that results in predictable operation of electrophysiology catheters.

In a first example, the present disclosure includes a medical device that can include an elongate tubular shaft having a first end and an opposite second end; an electrical component located proximate the first end of the shaft; a plurality of electrical conductors extending through the elongate tubular shaft and in electrical communication with the electrical component; and an interposer element mechanically and electrically coupling the electrical conductors to the electrical component. The interposer element can include a backing element that defines a longitudinal axis of the interposer element and that can have a first end portion and an opposite second end portion. The first end portion can have a forward edge defined by a center forward edge portion and first and second lateral forward edge portions on opposite sides of the center forward edge portion. The first and second lateral forward edge portions can extend at an angle relative to the center forward edge portion. The forward edge can be shaped so as to facilitate, during assembly of the medical device, advancement of the interposer element through the elongate shaft with the electrical conductors pre-attached to the interposer element.

In some such examples, the opposite second end portion can include an aperture configured to receive a stringing element to facilitate stringing the interposer element with the electrical conductors pre-attached thereto through the elongate shaft during assembly of the medical device.

In some such examples, the medical device can include a handle assembly attached to the first end of the elongate shaft, and the electrical component can be a printed circuit board component located within the handle assembly or an extension thereof.

In some such examples, the electrical component can be attached to the first end of the elongate shaft and can include a support element, a plurality of functional elements on the support element, and a plurality of electrical traces on the support element. At least one (e.g., each) of the electrical traces can be in electrical communication with a respective one of the functional elements and with a respective one of the interposer traces. In examples, the functional elements can include electrodes. In examples, the electrodes can be configured to sense intrinsic cardiac electrical signals. In examples, the electrodes can be configured to deliver ablative energy to target tissue. In examples, the functional elements can be ultrasound transducers.

In another example, the present disclosure includes a medical device that can include an elongate shaft having a proximal end and an opposite distal end; an electrical component coupled to the distal end of the elongate shaft; a plurality of electrical conductors extending through the elongate shaft; and an interposer element. The electrical component can include a support element; a plurality of functional elements located on the support element; and a plurality of electrical traces located on the support element. At least one (e.g., each) of the electrical traces can be in electrical communication with a respective one of the plurality of functional elements. At least one (e.g., each) of the electrical conductors is in electrical communication with a respective one of the electrical traces. The interposer element can mechanically couple the electrical conductors to the support element and can electrically couple at least one (e.g., each) of the electrical conductors to the respective one of the electrical traces.

In some such examples, the backing element can have a first end portion and an opposite second end portion. The first end portion can have a forward edge defined by a center forward edge portion and first and second lateral forward edge portions on opposite sides of the center forward edge portion. The first and second lateral forward edge portions can extend rearwardly at an angle relative to the center forward edge portion.

In some such examples, the second end portion of the interposer element can include a plurality of interposer traces and one or more open window(s) extending through the backing element therein. The open window can be configured to facilitate alignment of the interposer traces with an electrical component during assembly of the medical device.

The present disclosure also includes method of assembling a medical device. The method can include selecting an interposer element that can include a backing element that defines a longitudinal axis of the interposer element and that can have a first end portion and an opposite second end portion. The first end portion can have a forward edge defined by a center forward edge portion and first and second lateral forward edge portions on opposite sides of the center forward edge portion. The first and second lateral forward edge portions can extend at an angle relative to the center forward edge portion. The forward edge can be shaped so as to facilitate, during assembly of the medical device, advancement of the interposer element through the elongate shaft with the electrical conductors pre-attached to the interposer element. The method can include attaching the electrical conductors to the interposer element. The method can include stringing the interposer element through an elongate shaft of a medical device. The method can include attaching the interposer element to at least one or both of a functional element at a first end of the elongate shaft and a functional element at a second end of the elongate shaft.

While multiple examples are disclosed, still other examples of the present invention will become apparent to those skilled in the art from the following detailed description, which shows and describes illustrative examples of the invention. Accordingly, the drawings and detailed description are to be regarded as illustrative in nature and not restrictive.

While the invention is amenable to various modifications and alternative forms, specific examples have been shown by way of example in the drawings and are described in detail below. The intention, however, is not to limit the invention to the particular examples described. On the contrary, the invention is intended to cover all modifications, equivalents, and alternatives falling within the scope of the invention as defined by the appended claims.

DETAILED DESCRIPTION

Figure 1A:
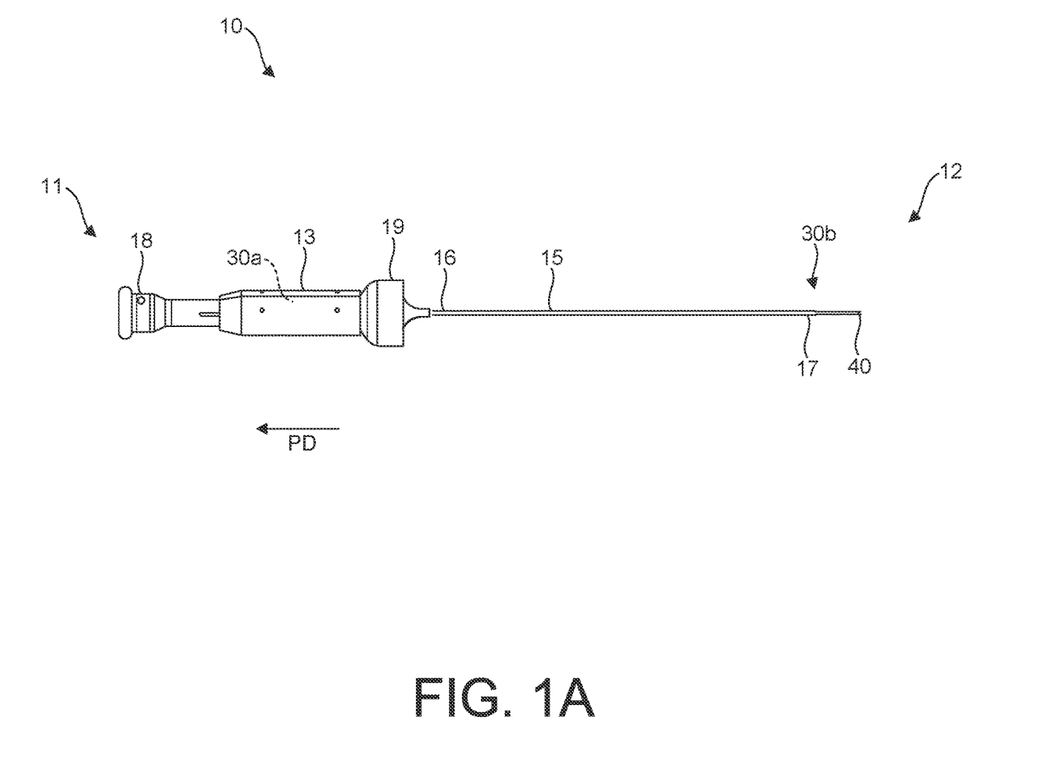
FIG. 1A is a side elevation view of a medical device, according to examples of the present disclosure.
Figure 1B:
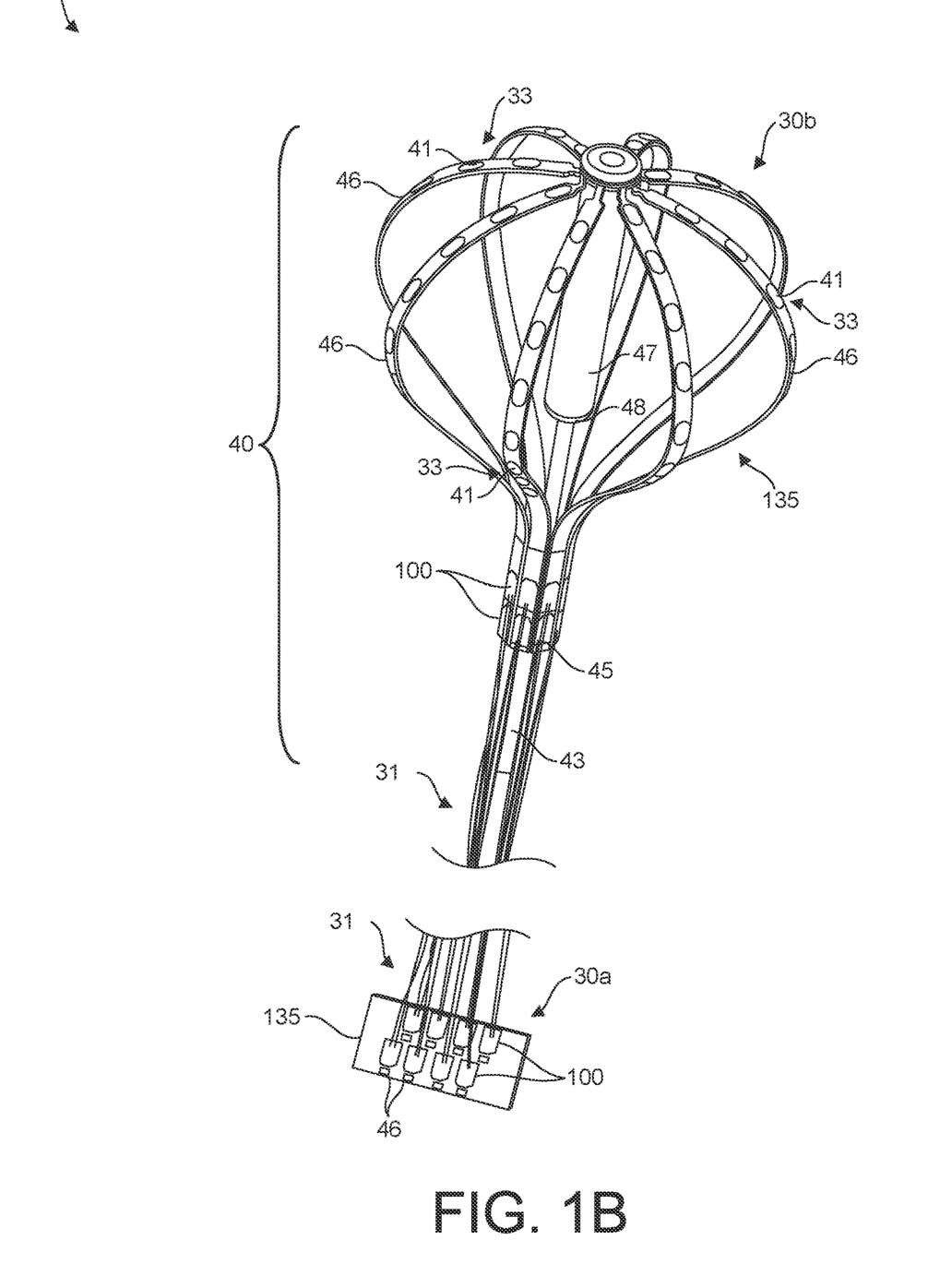
FIG. 1B is a perspective schematic view of the medical device of FIG. 1A having an expanded electrode assembly, according to examples of the present disclosure.

FIGS. 1A and 1B show a medical device 10, according to examples of the present disclosure. FIG. 1A shows an assembled medical device 10, and FIG. 1B shows a schematic view of electrical connections in the medical device 10 of FIG. 1A. The medical device 10 shown in these figures can be useful in electrophysiology (EP) procedures. In some cases, as shown in FIGS. 1A and 1B, the medical device 10 is an EP catheter 10, more details of which will be discussed below. Of course, the EP catheter 10 is just an example of many other medical devices 10 (including other catheters) that are included within the scope of this disclosure.

As shown in FIG. 1A, the EP catheter 10 has, for orientation purposes, a proximal end 11 and a distal end 12. The EP catheter 10 has a handle assembly 13 located at the proximal end 11, an elongate shaft 15 extending distally from the handle assembly 13 having a shaft proximal end 16 and a shaft distal end 17. In some examples, the handle assembly 13 can include wires (e.g., pigtails) extending from the handle assembly 13 and first and second actuation mechanisms 18, 19, which are discussed further below. As also discussed further below, the handle assembly 13 can include one or more electrical components 30a, 30b that are electrically coupled, mechanically coupled, or both mechanically and electrically coupled to other components in the EP catheter 10. A physician can manipulate the handle assembly 13 to deliver, steer, rotate, deploy, and/or deflect the EP catheter 10 when performing a medical procedure. In addition, the elongate shaft 15 can include a lumen (not shown) extending therethrough, such that the elongate shaft 15 is an elongate tubular shaft, for example. But this feature is not required in all examples. The elongate shaft 15 can have sufficient flexibility and rigidity so as to navigate the tortuous pathways of a patient's vasculature system.

As will be appreciated by the skilled artisan, medical devices 10 such as the EP catheter 10 can include various electrical components 30a, 30b located at opposite ends of the medical device 10 and electrically coupled together by electrical conductors (see the electrical conductors 31 in FIG. 1B), e.g., wires, cables, and the like. As shown, there is an electrical component 30a in the handle assembly 13, and an electrical component 30b at the shaft distal end 17 of the elongate shaft 15. In the illustrated embodiment, the distal electrical component 30b is a mapping electrode assembly. In other embodiments, the distal electrical component 30b can take on other forms, e.g., an ultrasound imaging assembly comprising one or more ultrasound transducers, and ablation electrode assembly comprising one or more ablation electrodes. As will be explained in greater detail herein, the various embodiments of the present disclosure provide novel means for connecting the aforementioned electrical conductors to the various electrical components, and also facilitate ease of manufacture and assembly of the medical device 10

For illustration purposes, the EP catheter 10 of FIGS. 1A and 1B is a cardiac mapping catheter that can be used to map electro-anatomical characteristics of the heart in a cardiac mapping procedure. In the particular illustrated embodiment, the EP catheter 10 is a multi-electrode, "basket-type" mapping catheter having an expandable electrode assembly 40 that can be deployed at a target location within a patient's heart to sense cardiac electrical activity, among other things. In embodiments, the EP catheter 10 can be a version of the cardiac mapping catheter manufactured and marketed by Boston Scientific Corporation under the brand name INTELLAMAP ORION™ Mapping Catheter, or equivalents thereof. It is emphasized, however, that the foregoing type of EP catheter 10 is exemplary only, and that the various embodiments of the disclosure are useful for other types of medical devices 10 having functional electrical components (such as the electrical components 30a, 30b) to which electrical conductors 31 are connected. Other exemplary types of medical devices 10 can include ablation catheters and imaging catheters/probes (e.g., having functional elements 33 comprising ultrasound transducers, cameras, and the like), or multi-functional devices incorporating multiple types of functional electrical components.

FIG. 1B shows the EP catheter 10 of FIG. 1A having an expandable electrode assembly 40 of electrodes 41, according to examples of the present disclosure. As shown in FIG. 1B, the expandable electrode assembly 40 is in an expanded configuration (as compared to being in a collapsed configuration in FIG. 1A). As such, the expandable electrode assembly 40 is capable of being transitioned from a generally cylindrical, collapsed configuration suitable for delivery of the EP catheter 10 and the expandable electrode assembly 40 to a target location within the patient's heart and an expanded configuration suitable for use in a desired cardiac procedure, such as, for example, a mapping or ablation procedure. The expandable electrode assembly 40 can be mounted on the distal end 12 of deployment shaft 43 and include a proximal band 45. The expandable electrode assembly 40 can include flexible splines 46 mounted to a housing 47 encasing a position sensor (not shown), such as a position sensor with six degrees of position sensing. Sensor cap 48 can cover a proximal opening of the housing 47 to enclose the position sensor within the housing 47.

Figures 5A, 5B:
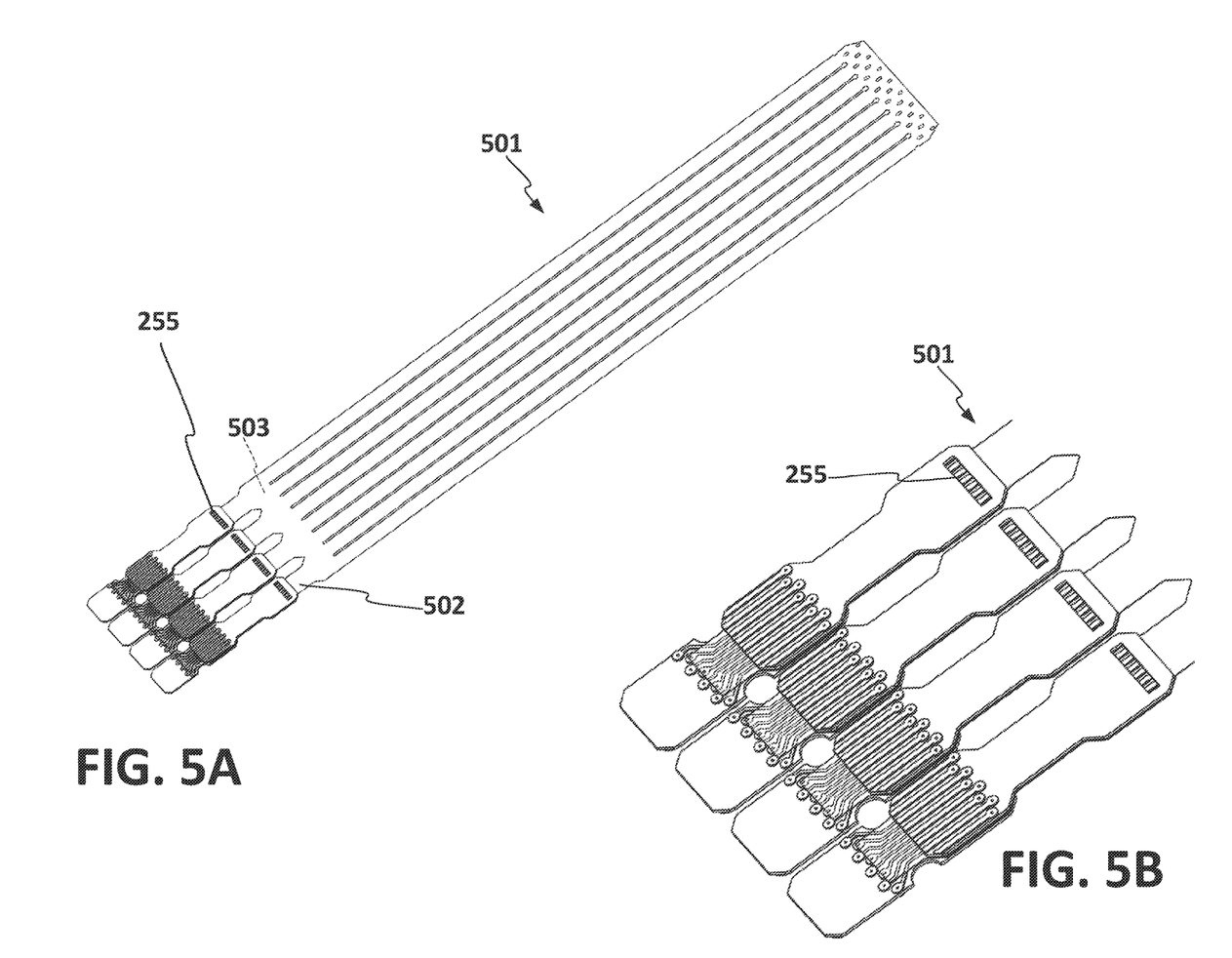
FIG. 5A is a perspective view of both an hourglass-type and a short-type interposer element attached at opposite sides of a flexible printed circuit, according to examples of the present disclosure.
FIG. 5B is a closeup view of the interposer elements in FIG. 5A, according to examples of the present disclosure.

Each electrode 41 can be electrically connected to electrical conductors 31 via the proximal band 45. For example, the flexible splines 46 can each include flexible printed circuits with traces connected to the electrodes 41. The traces can terminate to pads bonded on an inner and/or outer surface of proximal band 45. Interposer elements 100 can be used to electrically connect the electrical conductors 31 to trace pads on the inner and/or outer surface of proximal band 45. In addition, the proximal band 45 can be used to mechanically couple the expandable electrode assembly 40 to the distal end 12 of the elongate shaft 15. In some examples, there can be electrical traces on either side of the proximal band 45, and in this regard, there can be an interposer element 100 attached at either side of the proximal band 45. Under these circumstances, the interposer elements 100 may be arranged at the same or different positions along the length of the proximal band 45 (as shown in FIGS. 5A and 5B).

Additionally, as shown in FIG. 1B, the expandable electrode assembly 40 includes one or more electrodes 41. The electrodes 41 can be used for cardiac mapping or diagnosis, ablation, and/or other therapies involving the application of electrical energy to a patient's heart. As noted above, the handle assembly 13 can include a first actuation mechanism 18 that can be manipulated to transition the expandable electrode assembly 40 from the collapsed configuration (shown in FIG. 1A) suitable for delivery of the EP catheter 10 to a target location within a patient's body (e.g. the patient's heart) and the expanded configuration (shown in FIG. 1B) suitable for use in a diagnostic procedure and/or delivery of a therapy. In some cases, the first actuation mechanism 18 can include a mechanism (e.g., a pull wire, a rod, etc. (not shown)) that can be coupled to the expandable electrode assembly 40 and that can, when actuated in a proximal direction as indicated by the arrow PD, cause the expandable electrode assembly 40 to transition from the collapsed configuration to the expanded configuration. In other cases, the first actuation mechanism 18 can include a retractable sheath (not shown), which can permit the expandable electrode assembly 40 to self-expand from the collapsed configuration to the expanded configuration. These are just some examples of actuation mechanisms that can be used to facilitate expansion of the expandable electrode assembly 40 when the EP catheter 10 is in use. In some cases, the EP catheter 10 can include a deflectable distal portion (not shown) that a physician can manipulate using the second actuation mechanism 19 provided in the handle assembly 13 to position the expandable electrode assembly 40 nearer or adjacent to tissue of interest. The second actuation mechanism 19 can be similar to the first actuation mechanism 18, for example, in its manner of function and construction.

One or more interposer elements 100 according to principles of the present disclosure can be used to quickly make reliable electrical connections in medical devices 10, such as an EP catheter 10. As a first example, the electrical component 30b can be at the distal end 12 of the EP catheter 10. Under these circumstances, the medical device 10 can include an electrical component 30b (e.g., a second electrical component 30b) that can be coupled to the distal end 12 of the elongate shaft 15 and a plurality of electrical conductors 31 that can extend along the elongate shaft 15; and an interposer element 100. The electrical component 30b can include a support element 135 (e.g., flexible spine 46); a plurality of functional elements 33 (e.g., electrodes 41) located on the support element 135; and a plurality of electrical traces (not shown) located on the support element 135. At least one (e.g., each) of the electrical traces can be in electrical communication with a respective one of the plurality of functional elements 33, and at least one (e.g., each) of the electrical conductors 31 can be in electrical communication with a respective one of the electrical traces. The interposer element 100 can mechanically couple the electrical conductors 31 to the support element 135 and can electrically couple at least one (e.g., each) of the electrical conductors 31 to the respective one of the electrical traces. In examples, the support element 135 can include an attachment portion (e.g., proximal band 45), and the interposer element 100 can be mechanically secured thereto.

As a second example, in addition, or in alternative to the first example, the medical device 10 is again an EP catheter 10 and can include an elongate shaft 15 having a first end 11 (e.g., the proximal end 11) and an opposite second end (e.g., an opposite distal end 12); an electrical component 30a located proximate the first end 11 of the elongate shaft 15;

a plurality of electrical conductors 31 extending through the elongate shaft 15 and in electrical communication with the electrical component 30a; and an interposer element 100. The electrical component 30a can be similar to the electrical component 30b discussed above, as an example. The interposer element 100 can mechanically and/or electrically couple the electrical conductors 31 to the electrical component 30a. As described in further detail below, the interposer elements 100 can be used to string the electrical conductors 31 through the elongate shaft 15. As described throughout this disclosure, in some case, the interposer element 100 can be employed at only one end of the elongate shaft 15, and in other cases, the interposer element 100 can be employed on both ends of the elongate shaft 15.

Continuing with the second example, the medical device 10 can include a handle assembly 13 attached to the first end 11 of the elongate shaft 15. The electrical component 30a can be a printed circuit board component (such as a printed circuit board with electrical connections) located within the handle assembly 13. In examples, the electrical component 30a can be attached to the first end 11 of the elongate shaft 15 and can include a support element 135, a plurality of functional elements 33 on the support element 135, and a plurality of electrical traces (not shown) on the support element 135. Some electrical components 30a are in the form of a flexible circuit, which can have traces on two sides: top and bottom, for example. Under these circumstances, there can be one interposer element 100 coupled to the top of the flexible circuit and another interposer element 100 coupled to the bottom of the flexible circuit.

When assembled as discussed herein, the one or more interposer elements 100 can facilitate electrical communication between components of the medical device 10. In examples, the interposer element 100 can include a backing element (see the backing element 250 in FIGS. 2A-2C) and a plurality of interposer traces (see the interposer traces 252 in FIGS. 2A-2C) located thereon, for example, on either or both of a top surface 101 and a bottom surface 102. For instance, the electrical conductors 31 can be pre-attached to the interposer traces 252 on the top surface 101 and an open window 255 (as discussed further below) can then facilitate connecting the interposer element 100 to electrical components 30a, 30b. At least one (e.g., each) of the interposer traces can be in electrical communication with one of the electrical conductors 31 and the corresponding respective one of the electrical traces. At least one (e.g., each) of the electrical traces can be in electrical communication with a respective one of the functional elements 33 and with a respective one of the interposer traces. Electrical connections (e.g., via solder reflow) can be used to connect the electrical conductors 31 to the electrical traces. In examples, the functional elements 33 can include electrodes 41. In examples, the electrodes 41 can be configured to sense intrinsic cardiac electrical signals. In examples, the functional elements 33 can be ultrasound transducers. In examples, the electrodes 41 can be configured to deliver ablative energy to target tissue.

Figure 2A:
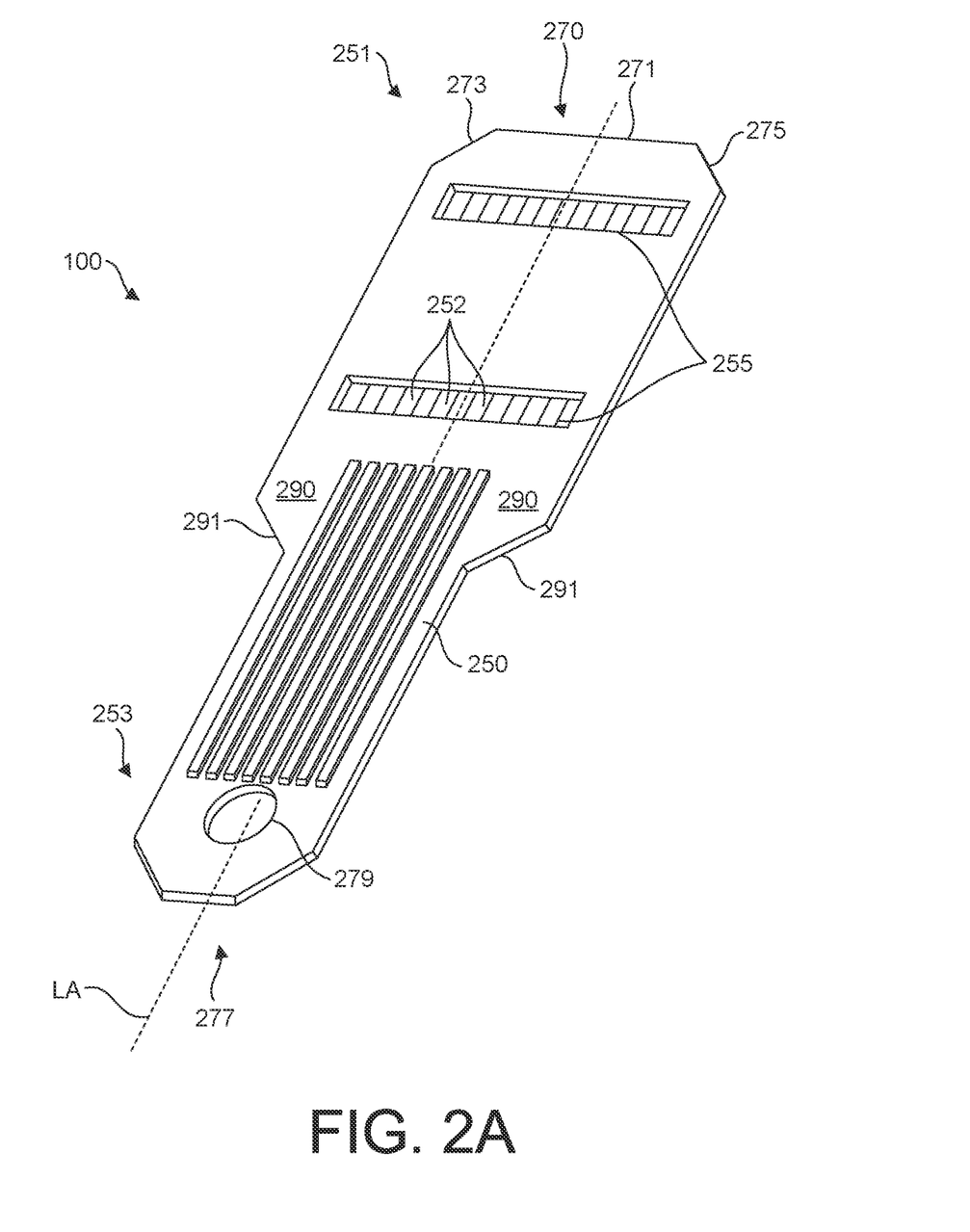
FIG. 2A is a perspective view of an interposer element, according to examples of the present disclosure.
Figure 2B:
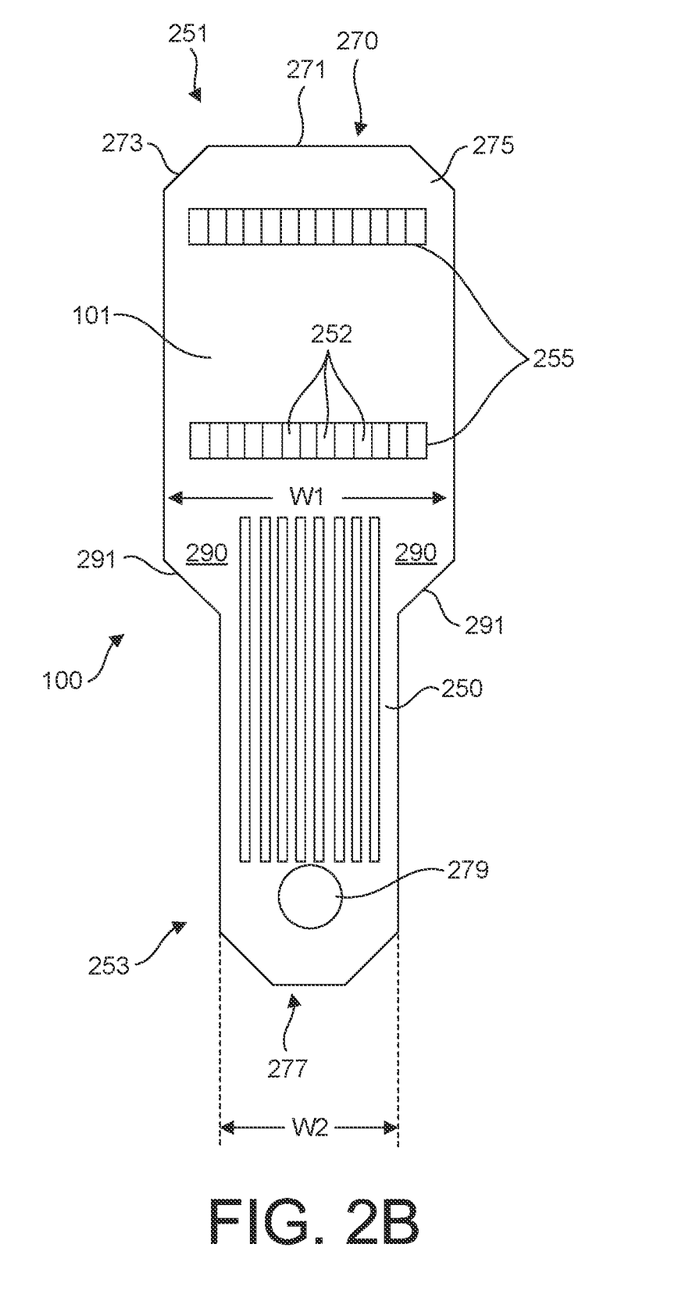
FIG. 2B is a top view of an interposer element, according to examples of the present disclosure.
Figure 2C:
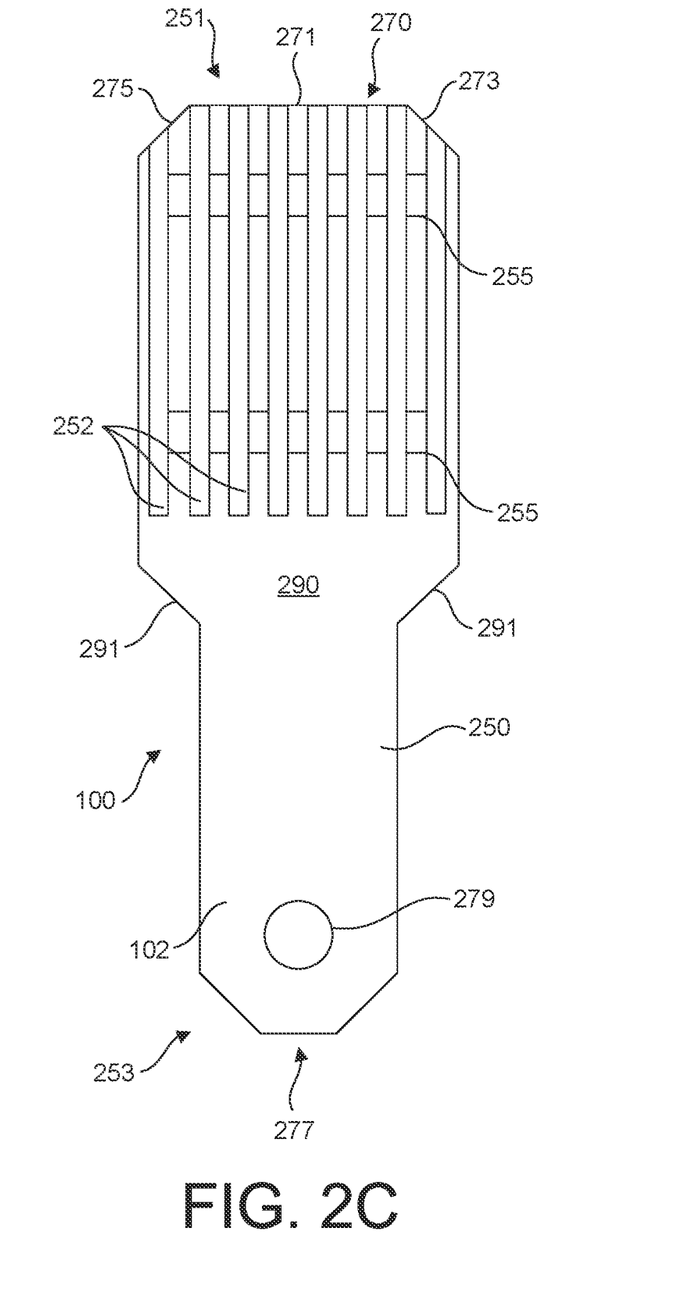
FIG. 2C is a bottom view of an interposer element, according to examples of the present disclosure.

FIGS. 2A-2C show various views of an interposer element 100. FIG. 2A shows a perspective view of an interposer element 100, according to examples of the present disclosure. FIG. 2B shows a top view of an interposer element 100, according to examples of the present disclosure. FIG. 2C shows a bottom view of an interposer element 100, according to examples of the present disclosure. More details of the interposer element 100 will be discussed below.

Geometry of the interposer element 100 can facilitate assembly of the medical device. The interposer element 100 can include a backing element 250 that defines a longitudinal axis, LA, of the interposer element 100 and that can have a first end portion 251 and an opposite second end portion 253. The first end portion 251 can have a forward edge 270 defined by a center forward edge portion 271 and first and second lateral forward edge portions 273, 275 on opposite sides of the center forward edge portion 271. In some instances, the first end portion 251 may mirror the second end portion 253 while in other instances the first end portion 251 may be different from the second end portion 253 (e.g., such that the interposer element 100 is eccentric). In this regard, the interposer element 100 can be made to match corresponding portions where the interposer element 100 is to be attached at the medical device.

Together, during assembly, the center forward edge portion 271 and the first and second lateral forward edge portions 273, 275 can be the leading or trailing edge as the interposer element 100 navigates through the elongate shaft. For example, while the forward edge 270 can be the leading edge (such that a rearward edge 277 at the opposite second end portion 253 is the trailing edge), as discussed herein the forward edge 270 is the trailing edge (such that 277 is the leading edge). Under these circumstances, it is useful for the rearward edge 277 to easily (e.g., with minimal drag and sufficient clearance) navigate through the elongate shaft while also having sufficient structural integrity to withstand any external forces (e.g., from pulling, friction, or other external forces) during navigation thereof. For example, the backing element 250 can be about 50 micron to withstand pull-out forces at the aperture 279 during assembly, to provide the ability for heat to transfer appropriately through the material, and to achieve reflow of the solder. In examples, the rearward edge 277 can be shaped so as to facilitate, during assembly of the medical device, advancement of the interposer element 100 through the elongate shaft with the electrical conductors pre-attached to the interposer element 100. In some such examples, the shape of the rearward edge 277 can be said to be semihexagonal but, of course, is not limited to a particular shape. It should be noted that the forward edge portion 270 can include similar (e.g., all) features discussed above with respect to the rearward edge 277 (e.g., shaped in the same or opposite direction to the forward edge 270).

Sized to move within the elongate shaft, the interposer element 100 can have edge portions about a periphery that are defined by one or more angles relative to other portions thereof. As noted below, an example of assembling a medical device according to principles of the present disclosure requires the interposer to navigate through the elongate shaft as a stringing element (e.g., a wire, twine, a rod, etc. (not shown)) pulls the interposer therethrough. Size and shape of the interposer element 100 can be influenced by surrounding components, such as to match clearance requirements within a shaft to avoid drive wire joints. Edge portions of the interposer element 100 can be generally straight-lined segments, arced segments, and the like. In an example, each of the center forward edge portion 271 and the first and second lateral forward edge portion 273, 275 can comprise a generally straight-lined segment. The first and second lateral forward edge portions 273, 275 can extend at an angle relative to the center forward edge portion 271. In such examples, the first and second lateral forward edge portions 273, 275 can extend rearwardly at an angle relative to the center forward edge portion 271. The angle of the first and second lateral forward edge portions 273, 275 relative to the center forward edge portion 271 can be about the same in magnitude and can vary in magnitude between examples.

Magnitudes of the angle can range from about 1 degree to about 60 degrees, for example, about 45 degrees as shown.

In examples, the opposite second end portion 253 can include an aperture 279 configured to receive a stringing element to facilitate stringing the interposer element 100 with the electrical conductors pre-attached thereto through the elongate shaft during assembly of the medical device. For example, the stringing element can be threaded through or removably attach to the aperture 279 such that pulling the stringing element in a direction along a longitudinal length of the elongate shaft thereby pulls the backing element 250 and, by extension, the interposer element 100 in the same direction. As the interposer element 100 is pulled through the elongate shaft, so too can be the pre-attached electrical conductors. Of course, it is not outside of the scope of this disclosure to consider stringing elements that act in the opposite manner (e.g., pushing the interposer through the elongate shaft). In any case, the aperture 279 can be positioned proximate to the forward edge 270 and can have sufficient edge distance so as to inhibit pull outs of the stringed element from the aperture 279 during assembly.

Both the stringing element and the electrical conductors can be longer than the elongate shaft so as to allow a portion of the stringing element to extend from the elongate shaft during assembly. In this way, one or more interposer elements 100 can be attached to the stringing element and pulled through the elongate shaft from one end to the other. Once pulled through, the interposer elements 100 can extend from one end of the elongate shaft (e.g., to be connected to an electrical component) and the electrical leads can extend from the other end of the elongate shaft (e.g., to be connected to another electrical component). It should be noted that some interposer elements 100 may be devoid of an aperture 279.

Width of the interposer element 100 can vary across the length thereof. Each width of the interposer can be wide enough to include one or more interposer traces. In examples, the first end portion 251 of the backing element 250 can have a first width, W1, in a direction orthogonal to the longitudinal axis, LA, of the interposer element 100, and the opposite second end portion 253 of the backing element 250 can have a second width, W2, in the direction orthogonal to the longitudinal axis, LA, of the interposer element 100. While the first width, W1, can be less than or equal to the second width, W2, in some cases, as discussed herein, the first width, W1, is greater than the second width, W2. In some instances, the overall width of the interposer element 100 can progressively (e.g., in a stepwise, periodic, or tapered fashion) change along the length of the interposer element 100. Under these circumstances, the backing element 250 can have an hourglass-like shape. In examples, the backing element 250 can include a transition portion 290 between the first end portion 251 and the opposite second end portion 253. The transition portion 290 can have transition side edges 291 that extend at an angle or along a curve (so as to be concave), for example, relative to the longitudinal axis, LA, of the interposer element 100. Under these circumstances, the transition portion 290 can be positioned between two portions of the interposer element 100 that extend relatively straight along the length of the interposer element 100 and that vary in width (e.g., the transition portion 290 having a third width that is less than or equal to the first width, W1, of the second width, W2). The length of the interposer element 100 can be long enough to include one or more interposer traces 252, which can be a plurality of shapes (e.g., tapered, zigzagged, variable width, and the like in any arrangement or combination) about their length.

When fanned in or fanned out (best seen in FIGS. 4A-4I and 5A-5C discussed below), the interposer traces can provide useful functionality of the interposer element 100. For instance, the interposer traces 252 can have a nominal pitch at one end and either a smaller pitch (so as to fan in) or wider pitch (so as to fan out) at the other end. Under these circumstances, the interposer element 100 can adapt to various pitches on the electrical components. For example, in this regard, the interposer element 100 can have more room to attach electrical conductors to the interposer element 100 and can be made to match corresponding portions of the functional element that the interposer element 100 is to be attached to. In any of these cases, interposer traces at the top surface 101 of the interposer element 100 can be electrically connected to the interposer traces 252 at the bottom surface 101 of the interposer element 100.

What can otherwise be blind connections can be remedied by including one or more open windows 255 in the interposer element 100 as shown in FIGS. 2A-2C. In examples, the first end portion 251 can include a plurality of interposer traces 252 and at least one open window 255 extending through the backing element 250 (e.g., at the first end portion 251 and/or the opposite second end portion 253) and configured to facilitate alignment of at least one (e.g., each) of the interposer traces 252 with the electrical component during assembly of the medical device. To an extent, increased numbers of open windows 255 can result in higher visibility through the interposer element 100. In examples, the backing element 250 can include an open window 255 extending therethrough and configured to facilitate alignment of at least one (e.g., each) of the interposer traces 252 with the corresponding respective one of the electrical traces during assembly of the medical device. For example, to-be-coupled interposer traces 252 can extend over the open window 255 so as to allow a user to see relative positions between the electrical conductors and the interposer traces 252 on the interposer element 100 and electrical component. In some, but not all, examples, the interposer traces 252 can have a width of about 4 thousandths of an inch, at minimum, and a length of about 40 thousandths of an inch, at minimum, to allow sufficient surface area for solder and to create a strong mechanical joint. To create a mechanical or electrical joint, a low melting point solder, such as a Bi58Sn42 solder, could be used to reduce heat burden on underlying materials, or if improved mechanical strength is desired, solders such as SAC305 can be employed.

Figure 3:
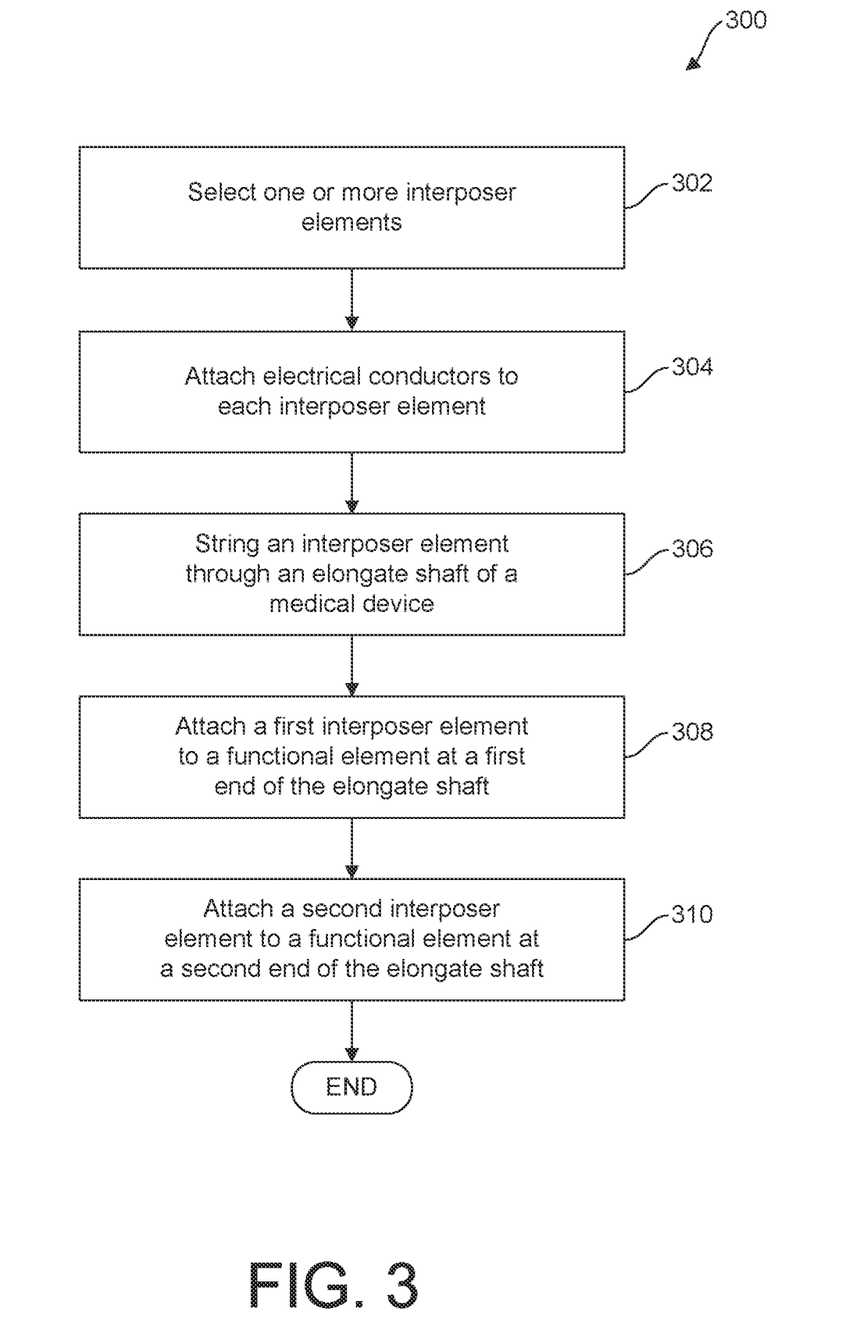
FIG. 3 is a flowchart of a method, according to examples of the present disclosure.

FIG. 3 is a flowchart of a method 300 of assembling a medical device, according to examples of the present disclosure. The medical device can be similar to those medical devices disclosed elsewhere herein, including the medical device 10. The method 300 can include, at step 302, selecting an interposer element that can include a backing element that defines a longitudinal axis of the interposer element and that can have a first end portion and an opposite second end portion. The first end portion can have a forward edge defined by a center forward edge portion and first and second lateral forward edge portions on opposite sides of the center forward edge portion. The first and second lateral forward edge portions can extend at an angle relative to the center forward edge portion. The forward edge can be shaped so as to facilitate, during assembly of the medical device, advancement of the interposer element through the elongate shaft with the electrical conductors pre-attached to the interposer element. The method 300 can include, at step 304, attaching the electrical conductors to the interposer element. The method 300 can include, at step 306, stringing (e.g., via a stringing element) the interposer element through an elongate shaft of a medical device. The method 300 can include attaching the interposer element to at least one of a functional element at a first end of the elongate shaft at step 308 and a functional element at a second end of the elongate shaft at step 310.

The illustrated example of the method 300 is just one example of many examples. It is understood that steps of the method 300 can be performed in any order and that steps discussed herein and known in the art can be added or omitted without departing from the scope of this disclosure. For example, some examples of the method 300 can omit the step 310 such that the interposer element is only employed on one end of the elongate shaft.

Alternative designs of the interposer element 100 and assemblies employing the interposer element 100 are shown in FIGS. 4A-4I and 5A-5C. As can be seen throughout these figures and as noted above, the interposer element 100 may assume a variety of geometrical forms, each of which, for example, may vary a peripheral profile, location or number of included features (such as open windows 255 and apertures), and dimensions (such as width, length, and thickness) of all or some portions of the interposer element 100 without departing from the functional aspects thereof. It is noted that even these examples are not exhaustive but rather illustrate some of many examples disclosed herein.

Figure 4A:
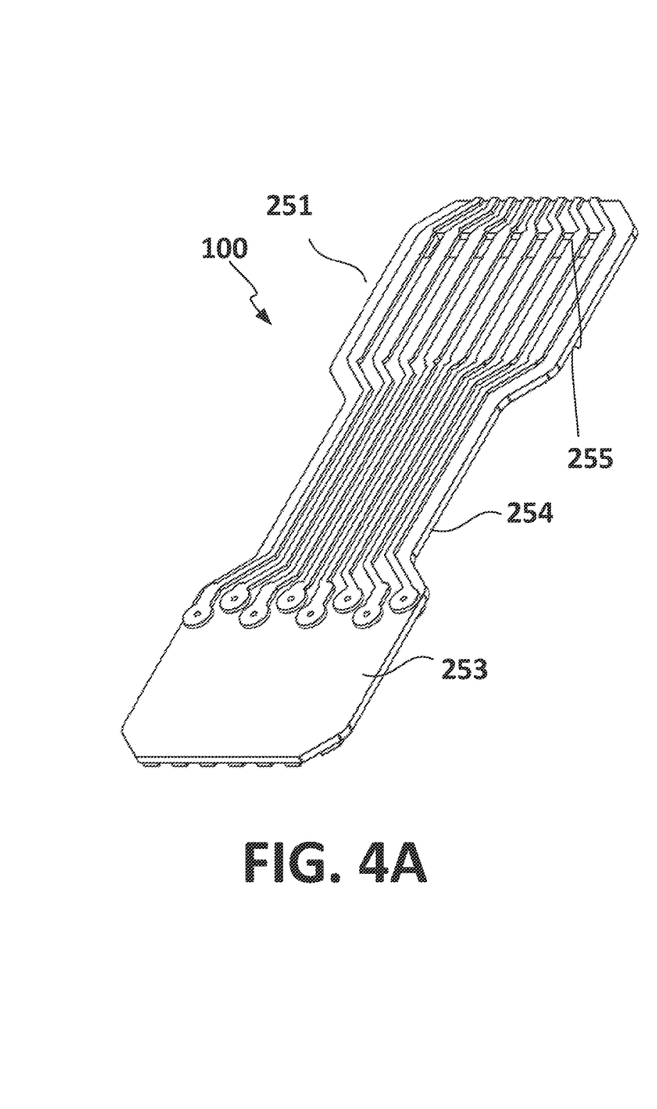
FIG. 4A is a perspective view of an hourglass-type interposer element, according to examples of the present disclosure.
Figure 4B:
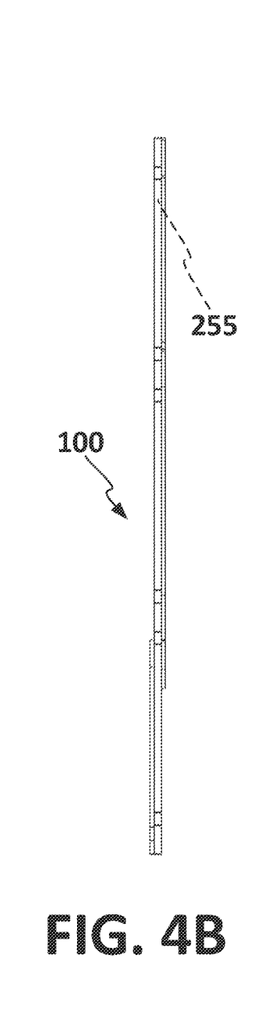
FIG. 4B is a side view of an hourglass-type interposer element, according to examples of the present disclosure.
Figure 4C:
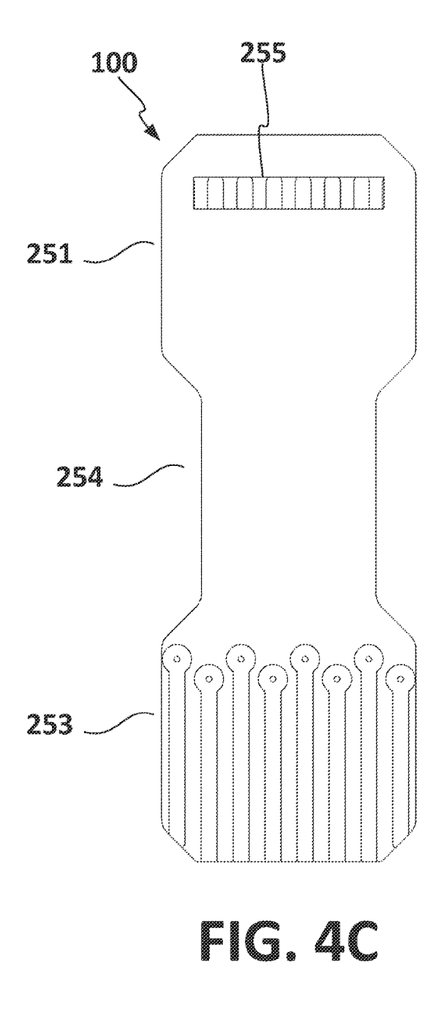
FIG. 4C is a bottom view of an hourglass-type interposer element, according to examples of the present disclosure.
Figure 4D:
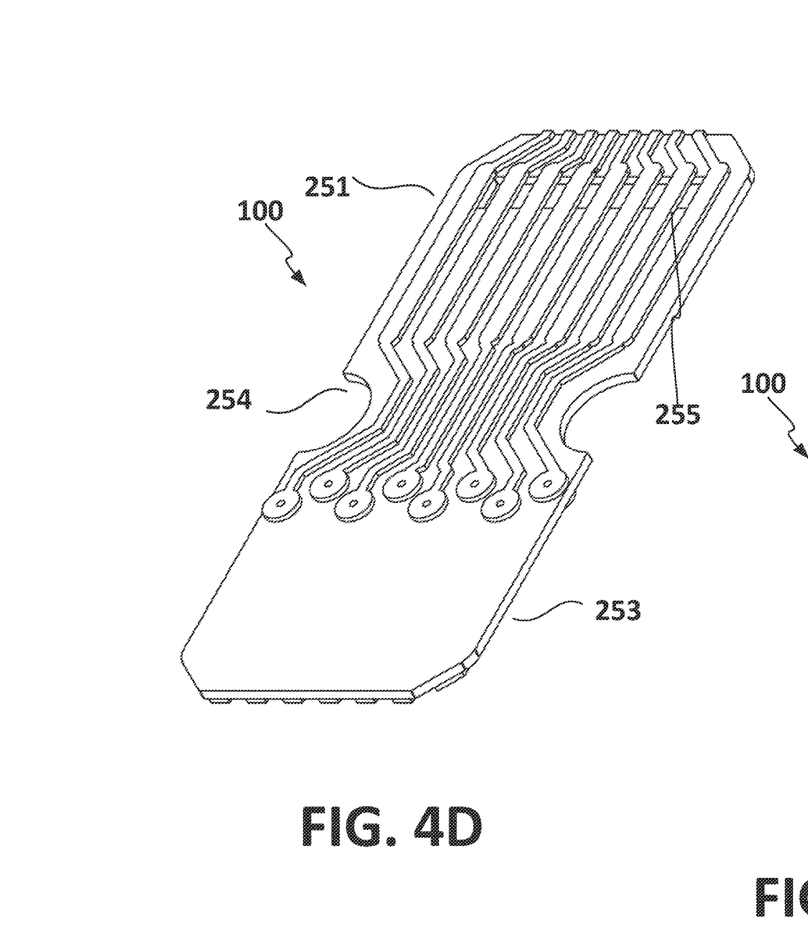
FIG. 4D is a perspective view of a short-type interposer element, according to examples of the present disclosure.
Figures 4E, 4F:
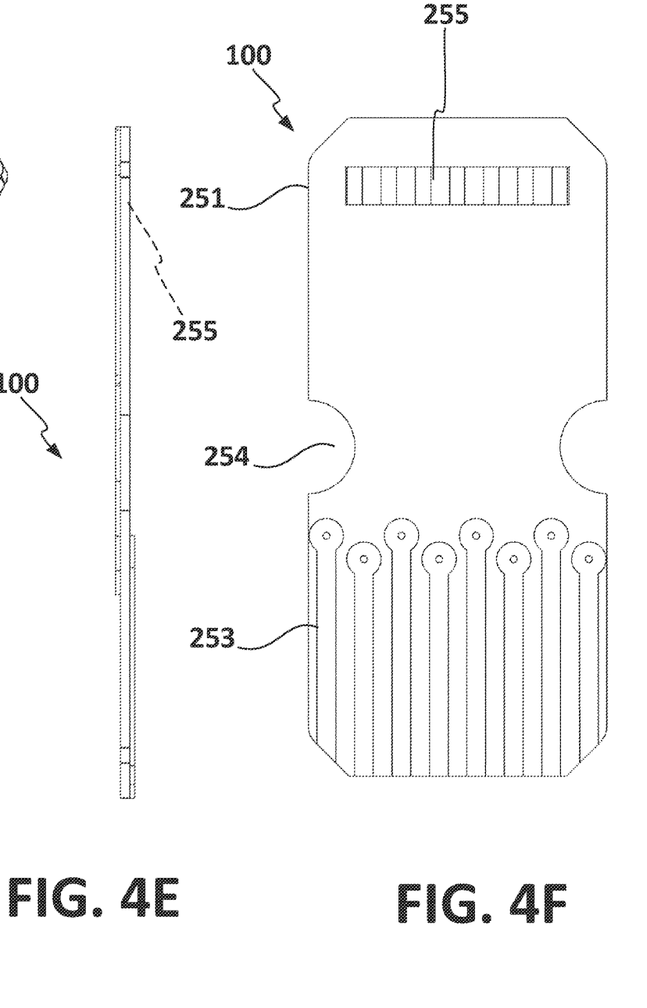
FIG. 4E is a side view of a short-type interposer element, according to examples of the present disclosure.
FIG. 4F is a bottom view of a short-type interposer element, according to examples of the present disclosure.
Figures 4G, 4H, 4I:
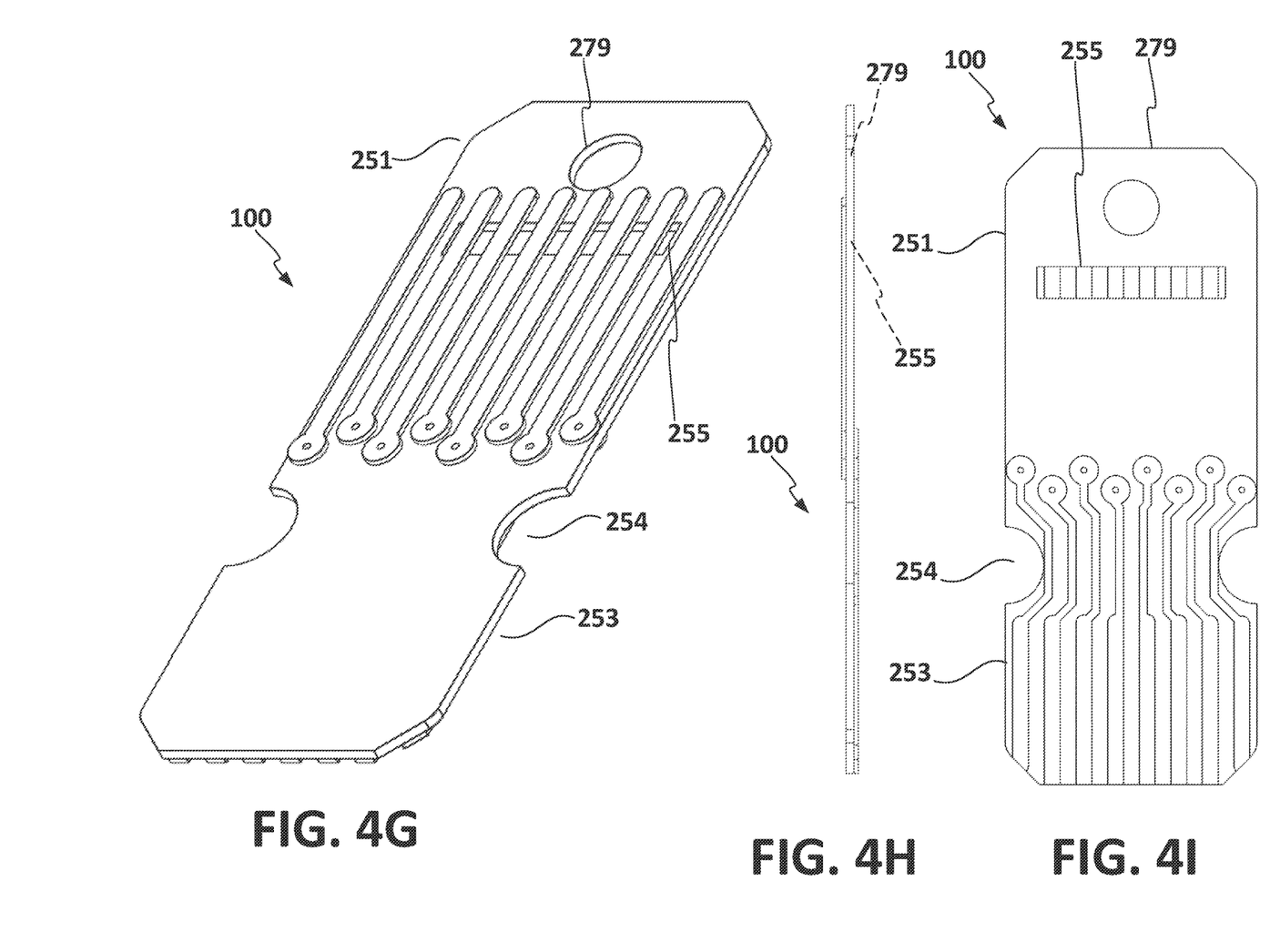
FIG. 4G is a perspective view of an eccentric-type interposer element, according to examples of the present disclosure.
FIG. 4H is a side view of an eccentric-type interposer element, according to examples of the present disclosure.
FIG. 4I is a bottom view of an eccentric-type interposer element, according to examples of the present disclosure.

FIGS. 4A-4I show various views of different interposer elements 100. FIGS. 4A-4C show various views of an hourglass-type interposer element 100. FIG. 4A is a perspective view of the hourglass-type interposer element 100, FIG. 4B is a side view of the hourglass-type interposer element 100, and FIG. 4C is a bottom view of the hourglass-type interposer element 100. FIGS. 4D-4F show various views of a short-type interposer element 100. FIG. 4D is a perspective view of the short-type interposer element 100, FIG. 4E is a side view of the short-type interposer element 100, and FIG. 4F is a bottom view of the short-type interposer element 100. FIGS. 4G-4I show various views of an eccentric-type interposer element 100. FIG. 4G is a perspective view of the eccentric-type interposer element 100, FIG. 4H is a side view of the eccentric-type interposer element 100, and FIG. 4I is a bottom view of the eccentric-type interposer element 100.

In the embodiment of FIGS. 4A-4C, the interposer element has opposite end portions 251, 253 and a middle portion 254 extending therebetween. As shown, the end portions 251, 253 are relatively wide compared to the middle portion 254. The relatively wide end portions 251, 253 allow for increased lateral spacing between the electrical traces thereon, thereby facilitating ease of making the associated electrical connections with the corresponding traces on the electrical component to which the interposer element 100 is connected.

In the embodiment of FIGS. 4D-4F, the interposer element 100 includes opposite end portions 251, 253 and a middle portion 254 that includes a pair of semi-circular notches on opposite lateral sides. In embodiments, the notches can aid in alignment of the interposer element 100 relative to the electrical component to which it is attached. In embodiments, the size and/or shape of the notches can vary (i.e., it is not critical that they take a semi-circular form as shown).

As shown, the embodiment of FIGS. 4G-4I is similar to that of FIGS. 4D-4F, and includes opposite end portions 251, 253 and a middle portion 254 that includes a pair of semi-circular notches on opposite lateral sides. However, as illustrated, the embodiment of FIGS. 4G-4I is an eccentric interposer whereby the end portion 251 is relatively long (i.e., in the directed between the end portions 251, 253) compared to the end portion 253.

In the various embodiments, the illustrated geometries of the interposer elements 100 can be further tailored to accommodate a range of electrical component configurations.

Figure 5C:
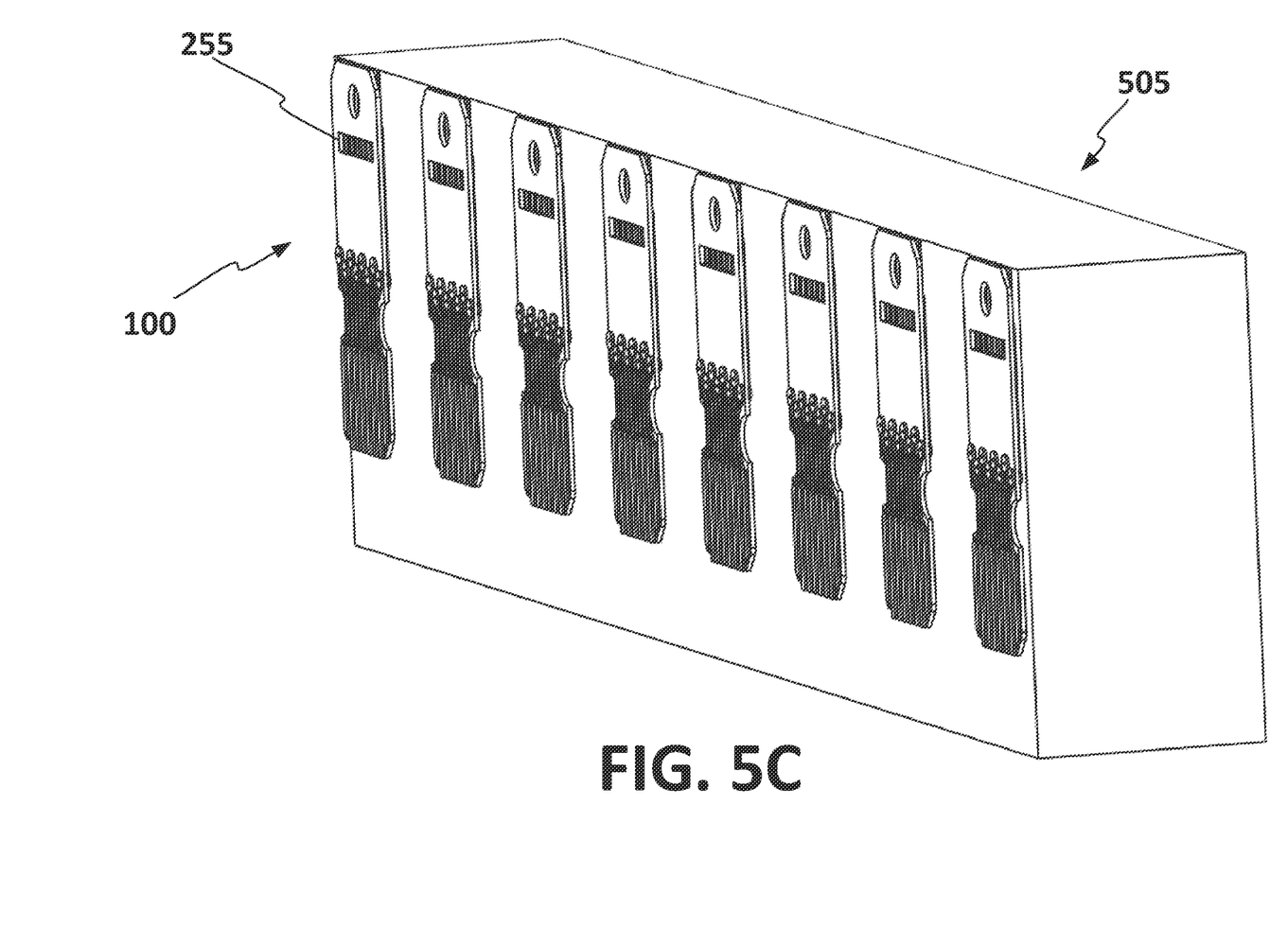
FIG. 5C is a perspective view of an eccentric-type interposer elements attached at an edge card, according to examples of the present disclosure.

FIGS. 5A-5C show various views of the different interposer elements 100 shown in FIGS. 4A-4I employed on certain functional elements. FIGS. 5A and 5B show the hourglass-type interposer element 100 of FIGS. 4A-4C attached at a top side 502 of a flexible printed circuit 501 and the short-type interposer element 100 attached at a bottom side 503 of the flexible printed circuit 501, with FIG. 5B being a closeup view of the interposer elements 100 in FIG. 5A. FIG. 5C shows the eccentric-type interposer elements 100 attached at an edge card 505.

Various modifications and additions can be made to the examples discussed without departing from the scope of this disclosure. For example, while the examples described above refer to particular features, the scope of this disclosure also includes examples having different combinations of features (e.g., across examples) and examples that do not include all of the described features. Accordingly, the scope of this disclosure is intended to embrace all such alternatives, modifications, and variations as fall within the scope of the claims, together with all equivalents thereof.

We claim:

1. A medical device comprising:
an elongate shaft having a first end and an opposite second end;
an electrical component located proximate the first end of the elongate shaft;
a plurality of electrical conductors extending through the elongate shaft and in electrical communication with the electrical component; and
an interposer element mechanically and electrically coupling each electrical conductor in the plurality of electrical conductors to the electrical component, the interposer element including a backing element defining a longitudinal axis of the interposer element and having a first major surface and an opposite second major surface, a first end portion and an opposite second end portion, wherein the first end portion has a forward edge defined by a center forward edge portion and first and second lateral forward edge portions on opposite sides of the center forward edge portion, wherein the first and second lateral forward edge portions extend at an angle relative to the center forward edge portion;
wherein the first end portion includes a plurality of interposer traces extending in a direction of the longitudinal axis and an open window extending through the backing element therein forming an aperture and across the plurality of interposer traces, wherein the interposer traces are exposed from the first major surface and the second major surface of the backing element.

2. The medical device of claim 1, wherein the first end portion of the backing element has a first width in a direction orthogonal to the longitudinal axis of the interposer element, and the opposite second end portion of the backing element has a second width in the direction orthogonal to the longitudinal axis of the interposer element, wherein the first width is different than the second width.

3. The medical device of claim 2, wherein the backing element further includes a transition portion between the first end portion and the opposite second end portion, the transition portion having transition side edges that extend at an angle or along a curve relative to the longitudinal axis of the interposer element.

4. The medical device of claim 1, wherein the open window extending through the backing element is configured to facilitate alignment of each interposer trace in the plurality of interposer traces with the electrical component during assembly of the medical device.

5. The medical device of claim 4, wherein the opposite second end portion includes an aperture configured to receive a stringing element to facilitate stringing the interposer element with each electrical conductor in the plurality of electrical conductors pre-attached thereto through the elongate shaft during assembly of the medical device.

6. The medical device of claim 1, wherein the medical device includes a handle assembly attached to the first end of the elongate shaft, and the electrical component is a printed circuit board component located within the handle assembly.

7. The medical device of claim 1, wherein the electrical component is attached to the first end of the elongate shaft and includes a support element, a plurality of functional elements on the support element, and a plurality of electrical traces on the support element, wherein each of the electrical traces is in electrical communication with a respective one of the functional elements and with a respective one of the interposer traces.

8. The medical device of claim 7, wherein at least some of the functional elements in the plurality of functional elements comprise electrodes that are configured to perform at least one of:
  sensing intrinsic cardiac electrical signals or
  delivering ablative energy to target tissue.

9. The medical device of claim 8, wherein the first end portion of the backing element has a first width in a direction orthogonal to the longitudinal axis of the interposer element, and the opposite second end portion of the backing element has a second width in the direction orthogonal to the longitudinal axis of the interposer element, wherein the first width is equal to the second width.

10. The medical device of claim 9, wherein the backing element further includes a transition portion between the first end portion and the opposite second end portion, the transition portion having a third width that is less than or equal to the first width.

11. The medical device of claim 7, wherein at least some of the functional elements in the plurality of functional elements are ultrasound transducers.

12. A medical device comprising:
  an elongate shaft having a proximal end and an opposite distal end;
  an electrical component coupled to the opposite distal end of the elongate shaft, the electrical component including:
    a support element;
    a plurality of functional elements located on the support element; and
    a plurality of electrical traces located on the support element, wherein each of the electrical traces is in electrical communication with a respective one of the plurality of functional elements;
  a plurality of electrical conductors extending along the elongate shaft, wherein each electrical conductor in the plurality of electrical conductors is in electrical communication with a respective one of the electrical traces; and
  an interposer element mechanically coupling each electrical conductor in the plurality of electrical conductors to the support element and electrically coupling each electrical conductor in the plurality of electrical conductors to the respective one of the electrical traces;
  wherein the interposer element includes a backing element and a plurality of interposer traces located thereon, the backing element having a first major surface and an opposite second major surface, wherein each interposer trace in the plurality of interposer traces is in electrical communication with one of the electrical conductors and the corresponding respective one of the electrical traces, wherein the backing element includes an open window extending therethrough forming an aperture and across the plurality of interposer traces, wherein the interposer traces are exposed from the first major surface and the second major surface of the backing element.

13. The medical device of claim 12, wherein the backing element has a first end portion and an opposite second end portion, wherein the first end portion has a forward edge defined by a center forward edge portion and first and second lateral forward edge portions on opposite sides of the center forward edge portion, wherein the first and second lateral forward edge portions extend rearwardly at an angle relative to the center forward edge portion.

14. The medical device of claim 12, wherein the open window is configured to facilitate alignment of each interposer trace in the plurality of interposer traces with the corresponding respective one of the electrical traces during assembly of the medical device.

15. The medical device of claim 12, wherein the support element includes an attachment portion, and wherein the interposer element is mechanically secured thereto.

16. The medical device of claim 12, wherein the backing element includes an aperture configured to receive a stringing element to facilitate stringing the interposer element with each electrical conductor in the plurality of electrical conductors pre-attached thereto through the elongate shaft during assembly of the medical device.

* * * * *